(12) United States Patent
Derr et al.

(10) Patent No.: US 6,839,238 B2
(45) Date of Patent: Jan. 4, 2005

(54) MODULE FOR MEASURING PURPOSES

(75) Inventors: Andreas Derr, Wutöschingen (DE);
Manfred Streicher, Lenzkirch (DE);
Peter Schulz, Löffingen (DE)

(73) Assignee: Testo AG (DE)

( * ) Notice: Subject to any disclaimer, the term of this patent is extended or adjusted under 35 U.S.C. 154(b) by 14 days.

(21) Appl. No.: 10/450,355

(22) PCT Filed: Nov. 30, 2001

(86) PCT No.: PCT/EP01/14031
§ 371 (c)(1),
(2), (4) Date: Jun. 12, 2003

(87) PCT Pub. No.: WO02/49408
PCT Pub. Date: Jun. 20, 2002

(65) Prior Publication Data
US 2004/0127095 A1 Jul. 1, 2004

(30) Foreign Application Priority Data
Dec. 12, 2000 (DE) .......................... 100 61 854

(51) Int. Cl.[7] ............................. H05K 7/10; H05K 5/02; H01R 13/00
(52) U.S. Cl. ...................... 361/735; 361/728; 361/752; 361/730; 361/729; 361/731; 361/741; 361/756; 439/507; 439/928; 439/74
(58) Field of Search .................. 361/728–731, 361/733, 735, 741, 752, 754, 756, 790, 796; 439/928, 929, 507, 701, 74; 174/50

(56) References Cited

U.S. PATENT DOCUMENTS

| | | | | |
|---|---|---|---|---|
| 2,783,416 A | * | 2/1957 | Butler | .......................... 361/684 |
| 3,796,984 A | | 3/1974 | Selinko | |
| 4,501,460 A | * | 2/1985 | Sisler | .......................... 361/730 |
| 4,558,914 A | * | 12/1985 | Prager et al. | ................ 439/259 |

(List continued on next page.)

FOREIGN PATENT DOCUMENTS

| | | |
|---|---|---|
| DE | 1 590 715 A1 | 6/1970 |
| DE | 2 340 283 A1 | 2/1974 |
| DE | 37 20 099 A1 | 12/1987 |
| DE | 39 32 000 A1 | 4/1991 |
| DE | 295 13 782 U1 | 2/1997 |
| EP | 0 762 815 A1 | 3/1997 |
| EP | 0 823 834 A2 | 2/1998 |

*Primary Examiner*—Kamand Cuneo
*Assistant Examiner*—Dameon E. Levi
(74) *Attorney, Agent, or Firm*—Pendorf & Cutliff

(57) ABSTRACT

The invention relates to a module for measuring purposes comprising an electrical or electronic circuit, which has at least one power supply connection and at least one data line connection for connecting, in the manner of a bus, to at least one other module of the same type that is also used for measuring purposes. According to the invention, the electronic circuit (80) is arranged inside a housing, the housing has a first contact surface (90) and a second contact surface (91), and the first contact surface (90) is joined to the second contact surface (91) of the other module (22, 32, 42) in a manner that permits it to be mechanically detached. The at least one power supply connection has a power supply contact (84a, 85a) in the first contact surface (90) and has a corresponding power supply contact (84b, 85b) in the second contact surface (91). The at least one data line connection has a data line contact (86a, 87a) in the first contact surface (90) and has a corresponding data line contact (86b, 87b) in the second contact surface (91). When the first contact surface (90) is joined to the second contact surface (91) of the other module (22, 32, 42), the power supply contact (84a, 85a) in the first contact surface (90) is connected in an electrically conductive manner to the corresponding power supply contact (84b, 85b) in the second contact surface (91) of the other module (22, 32, 42), and the data line contact (86a, 87a) in the first contact surface (90) is connected in an electrically conductive manner to the corresponding data line contact (86b, 87b) in the second contact surface (91) of the other module (22, 32, 42).

22 Claims, 6 Drawing Sheets

U.S. PATENT DOCUMENTS

| | | | | |
|---|---|---|---|---|
| 4,578,628 A | * | 3/1986 | Siwiak | 320/127 |
| 4,718,858 A | | 1/1988 | Godfrey et al. | |
| 5,253,141 A | * | 10/1993 | Hellwig et al. | 361/686 |
| 5,288,251 A | * | 2/1994 | Sumida | 439/701 |
| 5,335,144 A | * | 8/1994 | Maroushek | 361/695 |
| 5,645,434 A | * | 7/1997 | Leung | 439/74 |
| 5,676,553 A | | 10/1997 | Leung | |
| 5,677,830 A | * | 10/1997 | Nogas et al. | 361/790 |
| 5,864,467 A | * | 1/1999 | Recchia et al. | 361/732 |
| 5,988,511 A | * | 11/1999 | Schmidt et al. | 235/492 |
| 6,038,130 A | * | 3/2000 | Boeck et al. | 361/735 |
| 6,059,614 A | * | 5/2000 | Shelby et al. | 439/717 |
| 6,085,925 A | * | 7/2000 | Chung | 220/4.02 |
| 6,137,686 A | * | 10/2000 | Saye | 361/732 |
| 6,141,221 A | * | 10/2000 | Tong et al. | 361/724 |
| 6,144,888 A | * | 11/2000 | Lucas et al. | 700/83 |
| 6,327,152 B1 | * | 12/2001 | Saye | 361/732 |
| 6,328,612 B1 | * | 12/2001 | Chung | 439/717 |
| 6,462,953 B2 | * | 10/2002 | Tong et al. | 361/732 |
| 6,607,408 B2 | * | 8/2003 | Milan | 439/752.5 |
| 6,716,047 B2 | * | 4/2004 | Milan | 439/284 |
| 6,726,509 B2 | * | 4/2004 | Milan | 439/752.5 |
| 6,760,218 B2 | * | 7/2004 | Fan | 361/683 |

\* cited by examiner

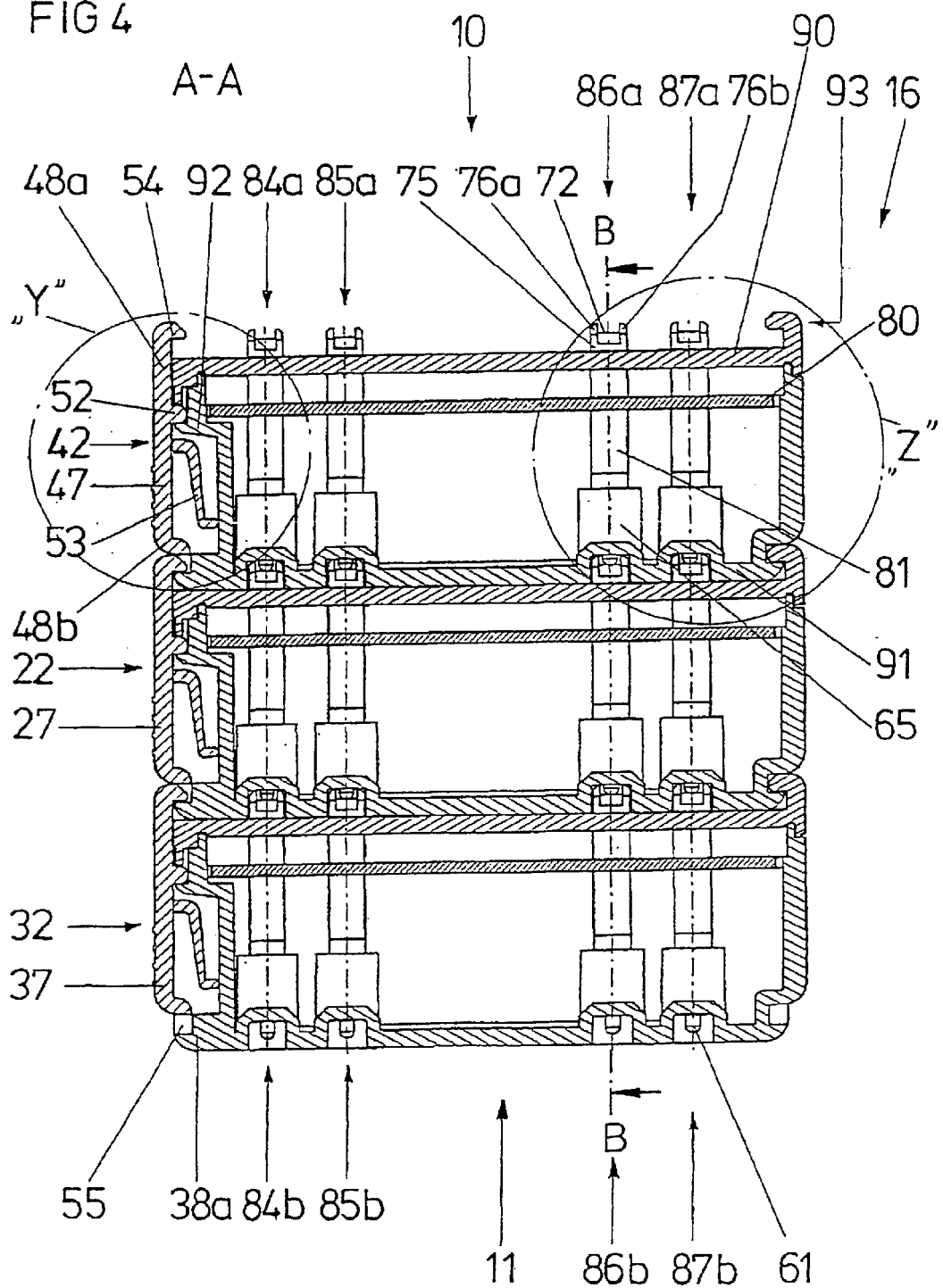

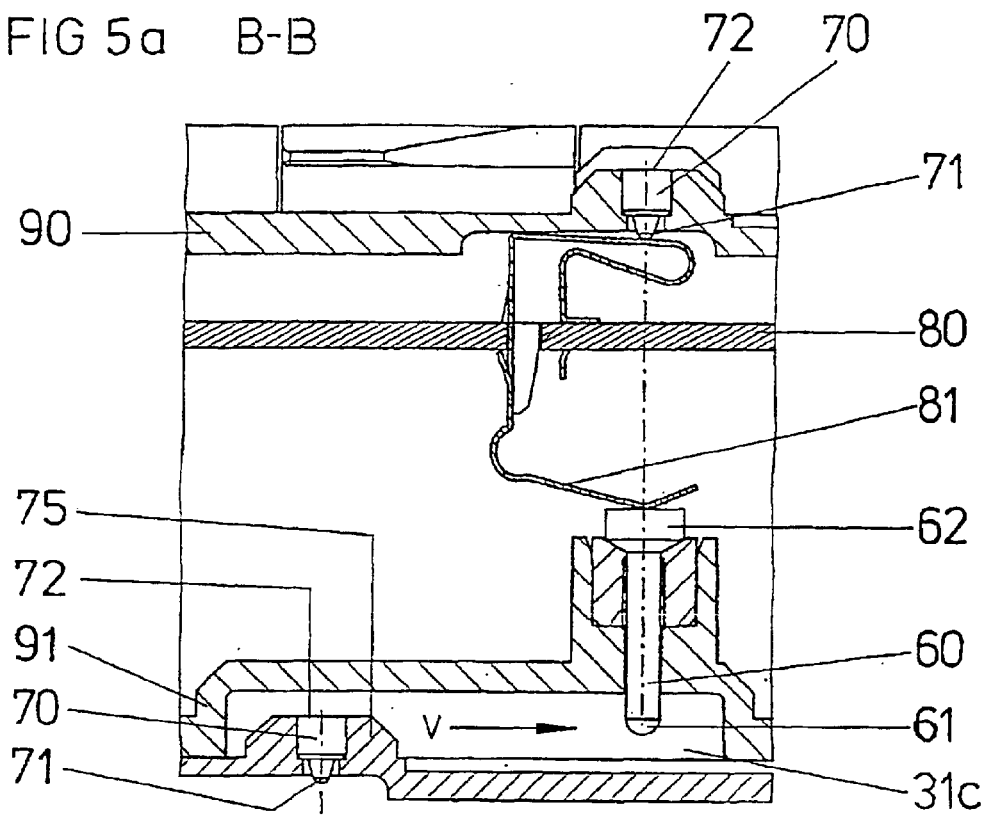
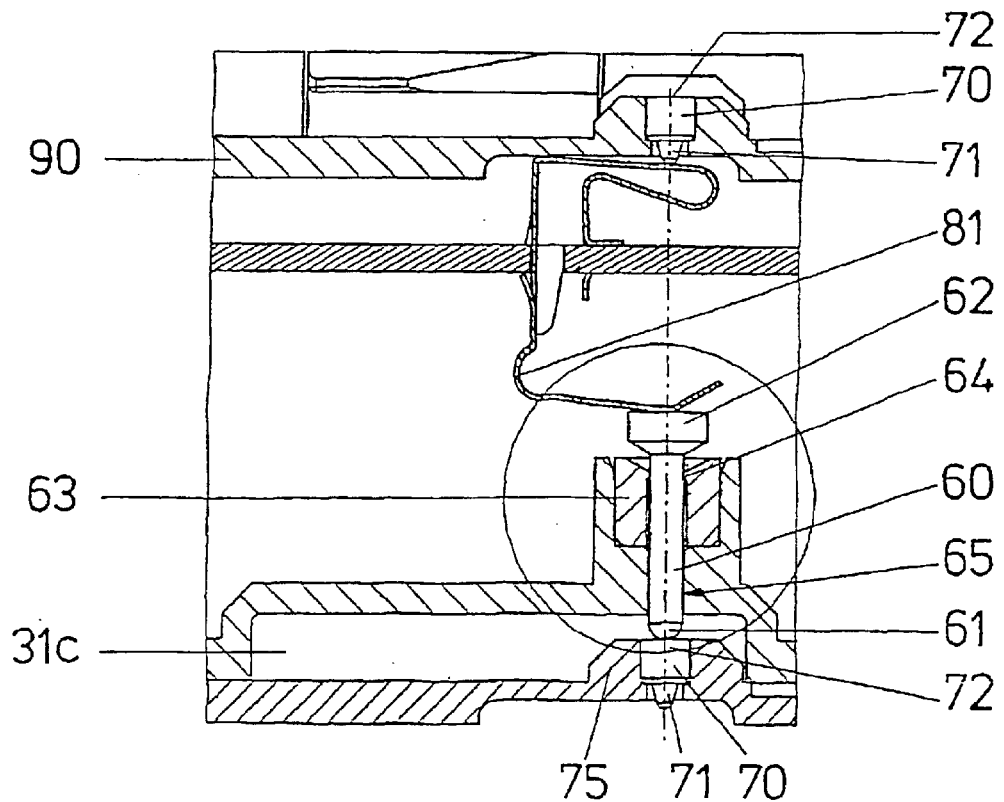

MODULE FOR MEASURING PURPOSES

CROSS REFERENCE TO RELATED APPLICATION

This application is a national stage of PCT/EP01/14031 filed Nov. 30, 2001, and based upon DE 100 61 854.5 filed Dec. 12, 2000 under the International Convention.

BACKGROUND OF THE INVENTION

1. Field of the Invention

The invention concerns a module for measuring purposes according to the main clause of claim 1.

2. Description of the Related Art

Housings or racks are known from the state of the art into which a limited number of so-called slide-in cards can be inserted. Among those working in this field, these are known by the name 19"-rack or the like.

Such modularly built slide-in cards, preferably boards carrying an electrical or electronic circuit, usually have one or more power supply connections and one or more data line connections, which are inserted into the plug arrangements located at the back of the corresponding rack, by inserting the slide-in cards into one of the racks described above.

As a rule, all the plug arrangements provided on the back side of a rack are of similar design and the corresponding contacts of the individual slots are connected together via an electrical connection. In this way, it is achieved that the slide-in cards inserted into the rack are connected together in the manner of a bus.

Although such systems were found to be useful, an inherent disadvantage is that the rack can hold only a limited number of slide-in cards. Therefore, such a system is not freely scalable, but is always limited by the size of the corresponding rack. In addition, because of this predetermined constructional size, such a system has limited usefulness for the so-called portable measuring technique.

SUMMARY OF THE INVENTION

Thus, the task of the invention is to provide a system which no longer has the disadvantages mentioned above. Especially, a system should be provided which is freely scalable in any arbitrary manner and is not limited by the size of the rack. In addition, use at almost any arbitrary location should be possible. Finally, it should be useable both for very simple as well as complicated measuring purposes.

This task is solved by a module for measuring purposes according to the invention having the characteristics of the characterizing part of claim 1.

Advantageous embodiments and further developments of the invention are given in the subclaims.

The essential idea of the invention consists in the fact that the electronic circuit is arranged in a housing which has a first contact surface and a second contact surface. According to the invention, it is provided that the first contact surface can be connected to the second contact surface of another module of like design, so that it can be joined in a manner that permits it to be mechanically detached, that is, it can be in slidingly coupled, interlocked, snapped together or the like. It is provided that at least one power supply connection has a power supply contact in the first contact surface and a corresponding power supply contact in the second contact surface and that the at least one data line connection always has a data line contact in the first contact surface and a corresponding data line contact in the second contact surface. Specifically, this means that the corresponding power supply contacts or data line contacts are in cooperative engagement from the first contact surface to the second contact surface.

Moreover, it is provided that, in the connected state, that is, when the second contact surface of the additional module is joined to the first contact surface in the manner described above, the power supply contact in the first contact surface be in an electrical connection with the corresponding power supply contact in the second contact surface of the other module and, correspondingly, the data line contact in the first contact surface is an electrical connection with the corresponding data line contact in the second contact surface of the other module.

Forming connections between the individual modules (corresponding to the slide-in cards in the system according to the state of the art) is done directly by contacting the contacts arranged in the particular housing of the module and not with the aid of additional connections like in the system of the state of the art, which are, for example, components of a rack or optionally are to be produced with the aid of separate cables or lines.

In this way, it is made possible that, for example, with the aid of a single module, simple measurement tasks can be performed and, depending on the requirements, other modules can be joined together to a larger measuring unit according to the Lego principle. Furthermore, as a result, it is made possible to combine modules from a module assortment for almost any arbitrary measuring tasks. In this way, the measuring system can be assembled and disassembled again rapidly at almost any arbitrary location. Transportation of individual modules is possible as well as transportation of a larger connected total system. Furthermore, the danger of destruction or contamination of the actual electrical or electronic circuits is clearly reduced in comparison to the system according to the state of the art mentioned above.

A preferred embodiment of the invention provides that the joining of the module with the other module be done with the aid of a bayonet-like lock. The advantage of such a bayonet-like lock consists in the fact that, first of all, joining and separation of the connection can be done rapidly, but on the other hand, it can be done simply. Such bayonet-like lock has been found to be useful in many ways.

In an especially advantageous variant, it is provided that the first and second contact surfaces be essentially opposing housing surfaces arranged parallel to one another. A measurement unit is obtained by stacking several or a large number of such modules on top of one another. Thus, an especially compact measuring arrangement is obtained.

Hereby, it is especially advantageous when the first and second contact surfaces are the bottom and covering surfaces, so that the base necessary for the positioning of such a system is not increased by increasing the number of individual modules used.

An especially advantageous variant provides that the housing be essentially rectangular, a housing form which excels by its low space requirement.

According to the invention it is provided that, on the first contact surface, at least two guide rails are arranged which run essentially parallel to one another; on the side, which is away from the contact surface, engagement elements in the form of tabs or bars are formed which run essentially parallel to the contact surface, and on the second contact surface guide rails are arranged which are essentially parallel to one another and correspond to the guide rails of the first contact surface; on the side of these, which is away from the contact surface, engagement elements are formed which correspond to the engagement elements of the guide rails of the first contact surface and are essentially parallel to the contact surface, so that the engagement elements can be brought into overlapping contact with the corresponding engagement elements of another module and the modules held together in this way. First of all, an advantage of such an arrangement is that it can be produced with simple means, for example, with the aid of an injection molding method and, on the other hand, it makes it possible to produce safe and rapid connection between the individual modules, which can then be separated again, rapidly and safely. An embodiment of this variation provides that the engagement elements and the corresponding engagement elements are at such a distance that, in order to join the first contact surface to the second contact surface of the other module, the engagement elements can be engaged in the interval of the corresponding engagement elements of the second contact surface of the other module and, vice versa, the corresponding engagement elements of the second contact surface of the other module can be engaged in the interval of the engagement elements and, in this position, by shifting the particular modules against one another, the engagement elements can be joined to the corresponding engagement elements of the other module to form a joint which holds the module together.

In a further embodiment of this variant or in an individual embodiment independent of this variant of the module according to the invention, it is provided that a rocker lever be supported on a side surface of a rocker bearing arranged on the housing, so that it is tiltable. A lever arm of the rocker lever is supported against the force of a spring on the side surface of the module housing. The other lever arm of the rocking lever has a latch which can be engaged in a groove of the housing of the other module and can be locked with it. Such a rocker lever thus locks two attached modules to one another so they cannot be separated from one another unintentionally.

The locking and interlocking mechanism of the rocker lever can be realized in a simple manner by the fact that the latch engages in a groove formed from the guide rails and the engagement element. Accordingly, additional measures are not necessary in this variant.

Furthermore, according to the invention, it is provided that at least one contact of the first contact surface be a contact head with a contact surface inserted into a recess of the first contact surface.

Corresponding to this, the corresponding contact of the second contact surface is a contact tappet which is arranged so it can be shifted perpendicularly to the contact surface against the force of a spring. In this way, an electrically conducting joint between two attached and optionally locked modules can be produced simply and rapidly. The fact that the contact tappet can be shifted against a spring has the advantage that a reliable electrical contact can be produced even after frequent attachment processes, especially even when the corresponding contact side had been worn due to frequent use, or even contaminated or corroded.

An especially advantageous variant of the invention provides that, for producing the electrical contact between the contact head and the contact tappet, a spring plate be provided within the housing of a module, one end of which is supported by spring force against a contact tip of the contact head directed toward the inside of the housing and, on the end, it is supported against a contact surface of the contact tappet directed toward the inside of the housing.

Such a spring contact has the advantage, first of all, in comparison to a rigid contact that, in the case of shocks, breaking off of the electrical contact is largely avoided and, on the other hand, it has the advantage of simple mounting of a module without time-intensive soldering or attachment processes.

Furthermore, according to the invention, it is provided that the circuit be arranged on a board and that the spring plate be joined to the board mechanically, rigidly and in an electrically conducting manner. This variation of the embodiment of the invention has the advantage that no additional holder is required for the spring plate, since an attachment in the board within the housing of the module is required anyway. Thus, the board holds the spring plate securely, so that, for example, the cover or bottom plates forming the contact surfaces merely have to be put in place during manufacture or assembly.

Another variant of the invention provides that the contact tappet be guided so it can be shifted in a guide element. A sealing element is placed into this guide element, surrounding the contact tappet in the manner described above, so that it can be shifted; the inside has a sealing lip surrounding the contact tappet on its periphery for sealing. In this way, entry of water or other fluids inside the housing and destruction of the electrical or electronic circuits or individual electric or electronic circuit elements is prevented.

Another preferred variation of the embodiment provides that the contact surface of the contact head be enclosed by two bars aligned essentially parallel to the guide rails, extending above the contact surface of the contact head in such a way that touching it by a standardized measuring finger is impossible. Such a design of the invention serves as a safety device against electrostatic discharges.

In a corresponding manner, it is provided that the contact tip of the contact tappet, designed on the base of a groove formed in the contact surface, running essentially parallel to the guide rail and that the width of the groove be chosen so that touching the contact tip of the contact tappet by a standardized measuring finger is impossible. These two latter variants thus ensure that the electrical or electronic circuits or individual circuit elements, arranged in the module, will not harm the operators due to accumulated electric charge.

Modules with the following functions are provided:
a) Measured value recording module
b) Power supply module
c) Radio connection module to provide radio connection between measuring systems and measuring units built from one or several modules
d) Analog-digital converter module or digital-analog converter module
e) Modules with operating and display functions
f) Modules with printing functions
g) Smoke reporting modules

BRIEF DESCRIPTION OF THE DRAWINGS

A practical example of the invention is shown in the drawing and will be described in more detail below.

The following are shown.

Figure 2:
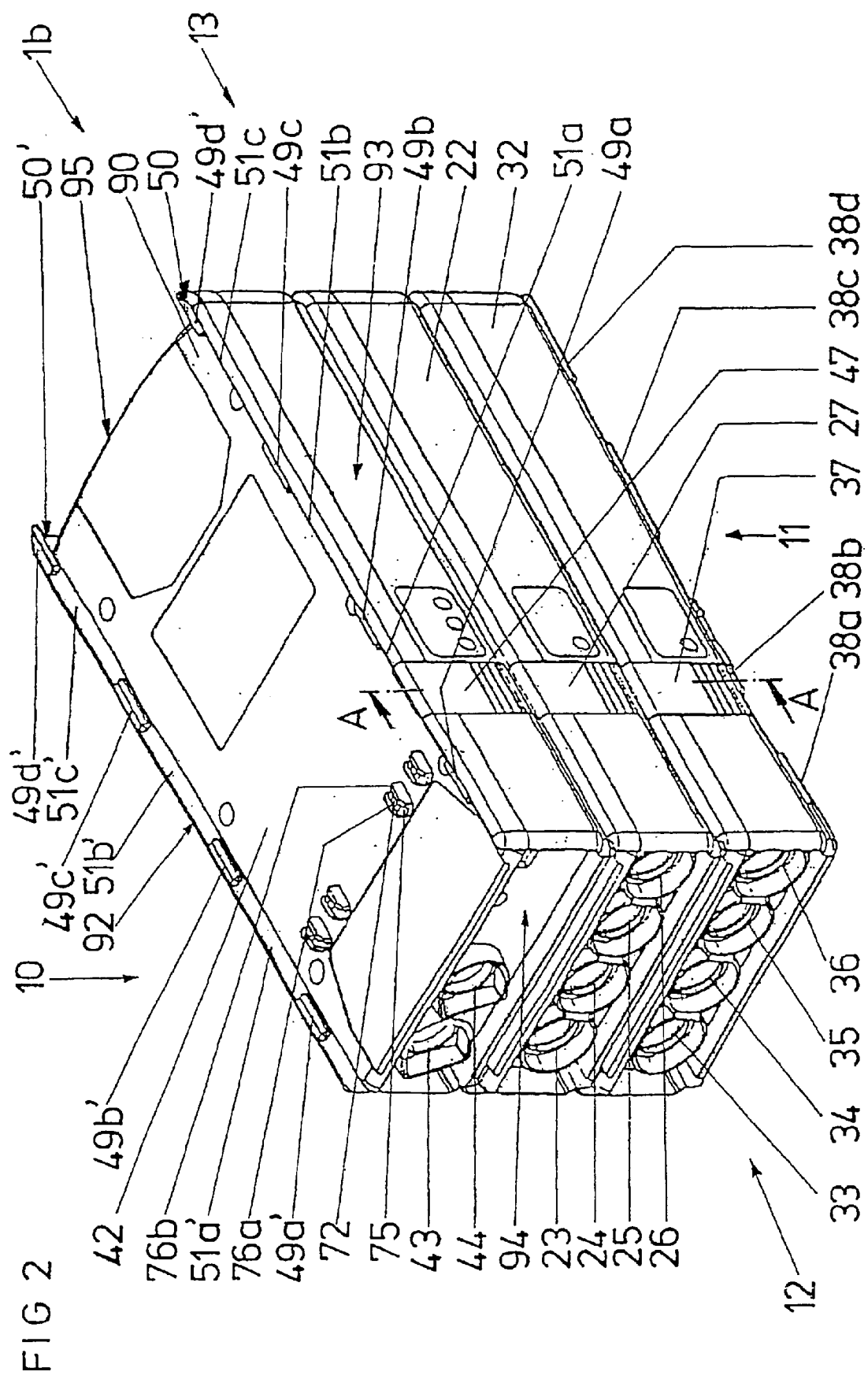
FIG. 2 is a measuring unit consisting of a radio module and two measuring modules according to the invention perspective view from above

FIG. 4 is the measuring unit according to FIG. 2, consisting of the radio module according to the invention and two measuring modules according to the invention cross-sectional representation along plane A—A FIG. 5 is the measuring unit according to FIG. 2 and FIG. 4 detailed view in a longitudinal section along B—B a) Radio module according to the invention and measuring module according to the invention, in the combined but not locked state.

b) Radio module according to the invention and measuring module according to the invention according to FIG. 5a) in the locked state.

Figure 6:
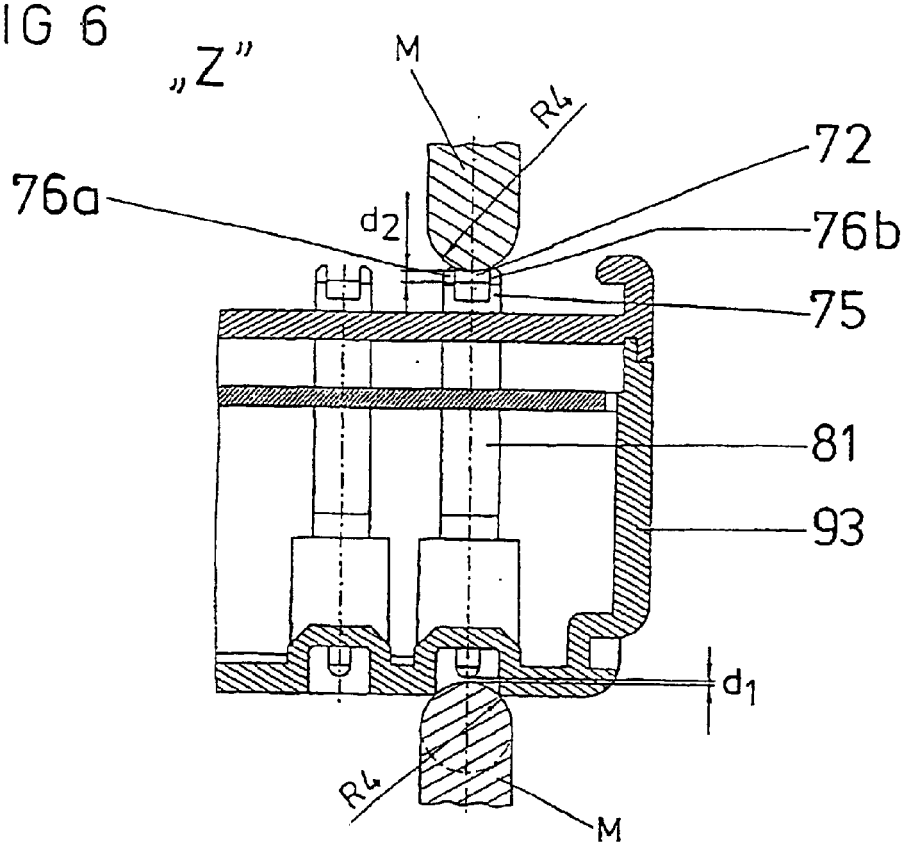

FIG. 6 is the measuring unit according to FIG. 2 and FIG. 4 with protective device against electrostatic discharges detail view Z from FIG. 4

Figure 7:
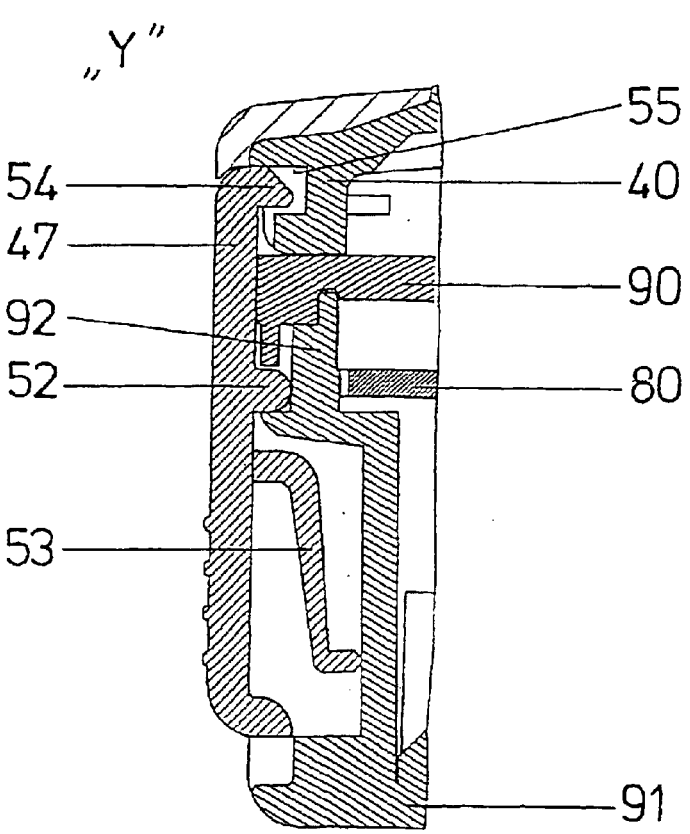

FIG. 7 is the measuring unit according to FIG. 2 and FIG. 4: locking mechanism with the latch of a rocker lever engaged in a guide rail of a measuring module according to the invention detail view Y from FIG. 4

DETAILED DESCRIPTION OF THE INVENTION

Figure 1:
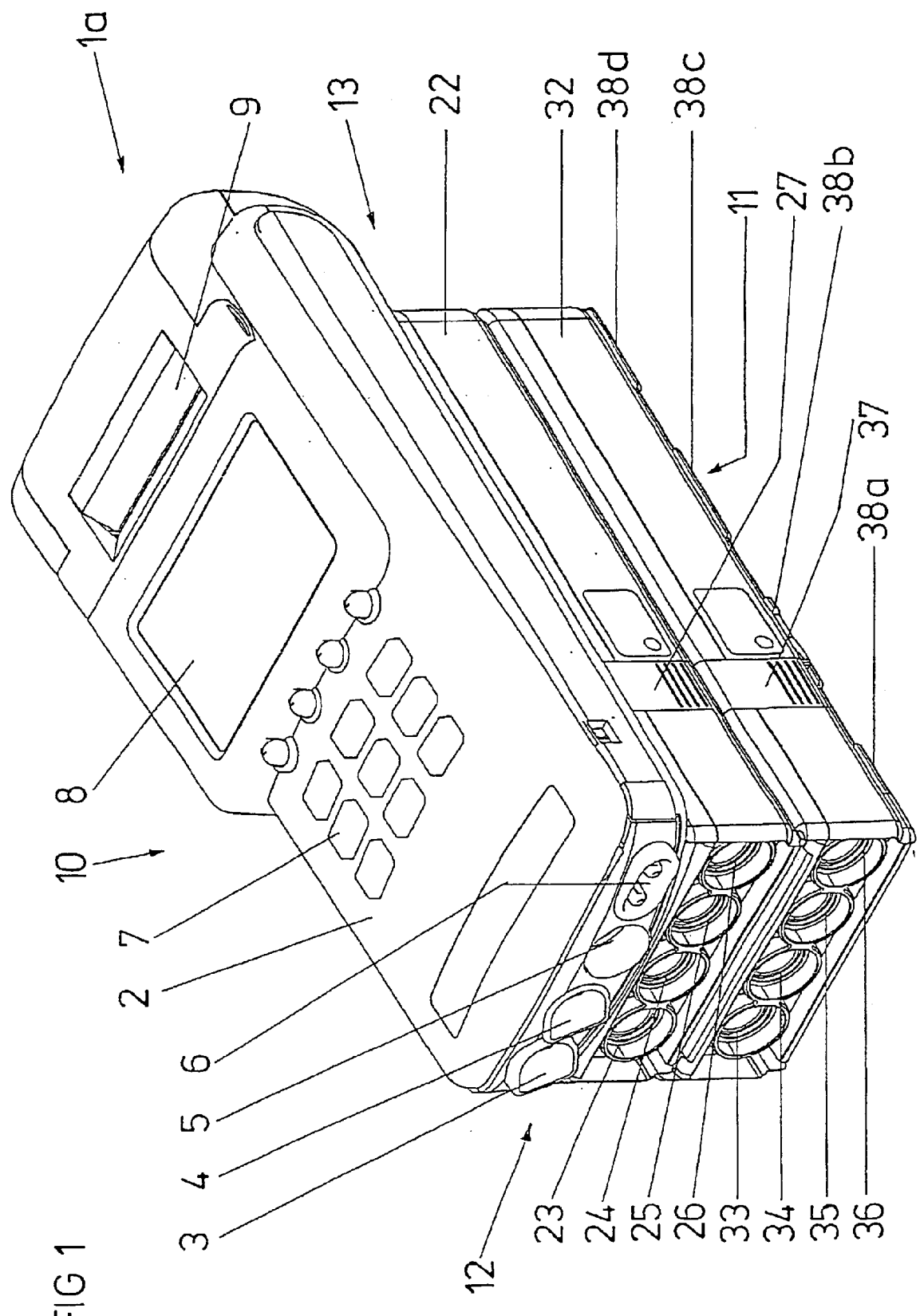
FIG. 1 is a measuring unit consisting of an operating, measuring, display and printing module according to the invention and two measuring modules according to the invention perspective view from above

FIG. 1 shows a measuring unit 1 a consisting of several individual modules 2, 22, 32 according to the invention. Specifically, the measuring unit 1a, shown in FIG. 1, has a combined operating, measuring, display and printing module 2, a measuring module 22 connected with this and another measuring module 32 connecting to the latter.

The operating, measuring, display and printing module 2, as it is obvious from the name, has a keyboard 7 for data input and thus for operation of module 2, a measuring channel connection 5 to connect it with a measuring cell, a measured value recorder, a sensor or similar. Furthermore, a display 8 is provided in order to display the measured value introduced to measurement channel connection 5 and as well as a small printer 9, for example, to produce a measuring or data protocol. Furthermore, the operating, measuring, display and printing module 2 has a sending element 3 and a receiving element 4, through which data communication, for example, via radio, infrared or similar, with another module, can be provided. Finally, the operating measuring display and printing module has a power supply connection 6 on its front side 12 in order to be able to supply module 2 with power from the outside. In the present example, the power supply is provided via a power plug to a conventional low voltage power connection, but it is also conceivable to make module 2 self-sufficient with regard to power or to operate it through an integrated accumulator, batteries or similar.

The two other measurement modules, 22 and 32, shown in FIG. 1, have a largely identical form. Both have four measuring channel connections 23, 24, 25 and 26 as well as 33, 34, 35 and 36 on their front side 12 in front surfaces 94. These measuring channel connections 23, 24, 25 and 33, 34, 35, 36, respectively, are designed in the manner of measuring channel connection 5 of the operating, measuring, display and printing module 2. Thus, they represent merely an extension for the connection of other eight measuring value recorder, sensors or similar.

According to the invention, it is provided that the operation, parametrization and control of the other measuring channel connections 23, 24, 25 and 26 of the measuring module 22, as well as the measuring channel connections 33, 34, 35 and 36 of measuring module 32 occur through the operating, measuring, display and printing module 2. The evaluation, data acquisition, protocolling, etc., also occurs via the operating, measuring, display and printing module 2, which, as will be described below, is connected mechanically as well as electrically to the individual modules 22 and 32.

In order to demonstrate how such a mechanical and electrical connection between the individual modules according to the invention is realized, FIGS. 2 to 7 show details of the mechanical locking and interlocking mechanism as well as that for producing an electrical connection between the corresponding contact elements necessary for the individual modules.

Figure 3:
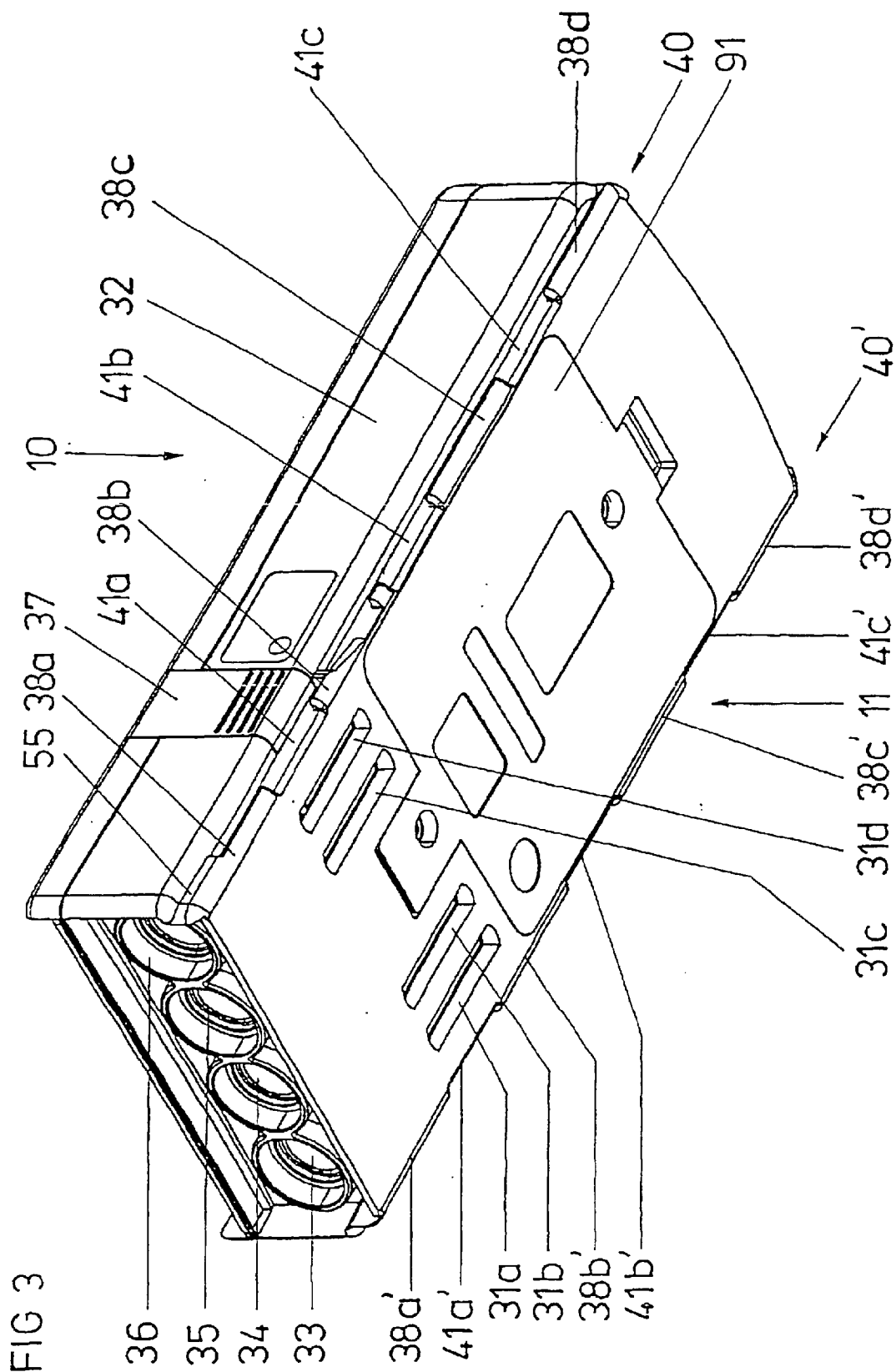
FIG. 3 is a measuring module according to the invention according to FIG. 1 and FIG. 2 perspective view from underneath

FIG. 2, first of all, shows a measuring unit 1b according to the invention, consisting of two measurement modules 22 and 32 according to the invention of the type described above, as well as instead of the operating, measuring, display and printing module 2 shown in FIG. 1, it has a radio module 42 according to the invention, namely shown in perspective view from the top onto the top side 10 of radio module 42. Corresponding to this, FIG. 3 shows, as an example, the measuring module 32 according to the invention according to FIGS. 1 and 2, also in a perspective view from underneath looking at the bottom side 11.

The housing of the modules 22, 32, 42 has an essentially rectangular shape. Consequently, it consists of six individual surfaces, which are designated below as side surfaces 92 and 93, front surface 94, back surface 95 as well as first contact surface 90 and second contact surface 91. The first and second contact surfaces 90, 91 are the oppositely arranged base and cover surfaces. The particular front surfaces (and optionally also the back surface 95) have, as described above, measuring channel connections 23, 24, 25, 26 or 33, 34, 35, 36, respectively, as well as sending elements 43 and 44.

The first contact surface 90 of a module 22, 32, 42 can be locked to the second contact surface 91 of another module 22, 32, 42. The locking mechanism is designed in the example in the manner of a bayonet lock. Specifically, two guide rails 50 and 50', running essentially parallel to one another, are arranged on the first contact surface 90; on the side away from contact surface 90, engagement elements 49a, 49b, 49c, 49d, 49a', 49b', 49c', 49d' are formed essentially parallel to contact surface 90. On the second contact surface 79, guide rails 40, 40' are arranged, again running parallel to one another, and essentially corresponding to the guide rails 50, 50' of the first contact surface 90. On these guide rails 40, 40', on their side away from contact surface 91, engagement elements 38a, 38b, 38c, 38d, 38a', 38b', 38c', 38d' are formed corresponding to the engagement elements 49a, 49b, 49c, 49d, 49a', 49b', 49c', 49d' of guide rails 50, 50' of the first contact surface 90. While in the first case, the engagement elements 49a, 49b, 49c, 49d, 49a', 49b', 49c', 49d' tend toward the inside against one another, in the second case, the engagement elements 38a, 38b, 38c, 38d, 38a', 38b', 38c', 38d' run directed toward the outside, so that the engagement elements 49a, 49b, 49c, 49d, 49a', 49b', 49c', 49d' can be brought into overlapping connection with the corresponding engagement elements 38a, 38b, 38c, 38d, 38a', 38b', 38c', 38d' of the other module and, in this way, two neighboring modules 42 and 22 or 22 and 32, respectively, are being held together.

In the present example, the engagement elements 49a, 49b, 49c, 49d, 49a', 49b', 49c', 49d' and the corresponding engagement elements 38a, 38b, 38c, 38d, 38a', 38b', 38c', 38d' are spaced in such a way that, for assembling the first contact surface 90 of a module 22, 42 with the second contact surface 91 of the neighboring module 32, 22, the engagement elements 49a, 49b, 49c, 49d, 49a', 49b', 49c', 49d' can engage in the intervals 41a, 41b, 41c, 41a', 41b', 41c' of the corresponding engagement elements 38a, 38b, 38c, 38d, 38a', 38b', 38c', 38d' of the second contact surface 91 of the neighboring module. In an analogous manner, the corresponding engagement elements 38a, 38b, 38c, 38d, 38a', 38b', 38c', 38d' of the second contact surface 91 of the other module can engage in the intervals 51a, 51b, 51c, 51a', 51b', 51c' of engagement elements 49a, 49b, 49c, 49d, 49a', 49b', 49c', 49d'. The particular modules 22, 32, 42 are brought into the fixed position, that is, in the position where the two neighboring modules 42, 22 or 22, 32, respectively, are held together, by being shifted in the position described above, so that the engagement elements 49a, 49b, 49c, 49d, 49a', 49b', 49c', 49d' engage with the corresponding engagement elements 38a, 38b, 38c, 38d, 38a', 38b', 38c', 38d' of the neighboring module 22, 32, 42.

Furthermore, according to the invention, it is provided that two neighboring modules 42 and 22 or 22 and 32, respectively, can be locked with the aid of a rocker lever 27, 37, 47. The special design according to the invention of such an interlocking mechanism can be seen in detail in FIG. 4, which shows the measurement unit according to FIG. 2, consisting of the radio module 42 according to the invention and two measurement modules 22 and 32 according to the invention in a cross-sectional representation along plane A—A shown in FIG. 2 and in the detail view Y from FIG. 4, which is shown in FIG. 7.

As can be seen from the drawings, the rocker lever 27, 37, 47 is supported tiltably on a rocker bearing 52 arranged on the side surface 92 of the particular housing. A lever arm 48b of rocker lever 27, 37, 47 is supported against the force of a spring 53 on the side surface 92 of the particular housing. In the drawing, the spring 53 is designed in the manner of a spring plate, but a spring, for example, with the aid of a spiral spring or similar, can also be considered.

The other lever arm 48a of the rocker lever 27, 37, 47 has a latch 54, which can be engaged in a groove 55 of the housing of the neighboring module and can be locked with it.

In the present case, the groove is formed by the guide rails 40 and the engagement element 38b.

As it was already presented in detail in the introductory part of the Specification, the individual modules 22, 32, 42 are joined together in a contacting manner through electrical contact locations which come into contact in the switched state. Especially, in the present case, two power supply contacts 84a, 85a are provided, which are arranged in the first contact surface 90 of a module 22, 32, 42 and can be brought into contact with the corresponding power supply contact 84b, 85b in the second contact surface 91 of the other neighboring module 22, 32, 42. Furthermore, data line contacts 86a, 87a are provided in the first contact surface 90 of a module 22, 32, 42, which can be brought into contact with the corresponding data line contacts 86b, 87b in the second contact surface 91 of the other neighboring module 22, 32, 42.

The concrete design of contacts 84a, 85a, 86a, 87a in the first contact surface 90 and of the corresponding contacts 84a', 85a', 86a', 87a' of the second contact surface 91 can be seen in the drawings according to FIG. 2, FIG. 3, FIG. 4 and FIG. 6. The electrical and mechanical bond between contacts 84a, 85a, 86a and 87a in the first contact surface 90 and the corresponding contacts 84a', 85a', 86a', 87a' of the second contact surface 91 within a module can be seen especially in FIGS. 4, 5a and 5b.

Specifically, as it can be seen in FIG. 5, the contacts 84a, 85a, 86a, 87a of the first contact surface 90 always consist of a contact head 70, which is placed in a recess 75 of the first contact surface 90, and has a contact surface 72. The corresponding contacts 84a', 85a', 86a', 87a' of the second contact surface 91 are essentially perpendicular to contact surface 91 against a contact tappet 60, guided against the force of a spring 81 so that it can be shifted.

The contact surfaces 72 of the particular contact heads 70 are always enclosed by two bars 76a and 76b, aligned essentially parallel to guide rails 50, 50'. These stand above contact surfaces 72 of the particular contact head 70, so that, especially as can be seen in FIG. 6, touching of it by a standardized measuring finger M is impossible. In the present case, the distance between the tip of the standardized measuring finger M with a tip radius of 4 mm and a contact surface 72 is designated with the aid of reference $d_2$.

In principle, the other contacts 84b, 85b, 86b, 87b with contact tappet 60 are designed similarly. As shown in FIG. 6, the particular contact tappets 60 are led from the base of grooves 31a, 31b, 31c, 31d running essentially parallel to the guide rails 40, 40' and formed in contact surface 91, where the width of the corresponding grooves 31a, 31b, 31c, 31d is chosen so that touching the particular contact tips 61 of contact tappet 60 by the standardized measuring finger M with a tip radius of 4 mm is impossible. The distance between the contact tip 61 of a contact tappet 60 and a standardized measuring finger M is shown with reference $d_1$ in the drawing.

As can be seen especially from the drawings according to FIG. 4 and FIGS. 5a and 5b, the bars 76a, 76b, which enclose the contact surfaces 72 of the particular contact heads 70, are designed specifically so that when sets of two modules 22, 32, 42 are joined together, they engage exactly in the particular grooves 31a, 31b, 31c, 31d from the base of which the particular contact tappets 60 are guided out. The electrical connection is now produced by the fact that, in the shifting process V described above, the corresponding contacts 84a, 85a, 86a, 87a are brought into connection with the corresponding contacts 84a', 85a', 86a', 87a'. In this case, the contact tip 61 of the contact tappet 60 is guided against the force of spring 81 above the recess 75 and the contact head 70 with contact surface 72 placed in it, where the bars 76a and 76b serve as guide rails for the contact tip 61 of contact tappet 60.

The guidance of the contact tappet 60 so it can be shifted under the action of a spring and the formation of the electrical connection between the particular contacts 84a, 84b, 85a, 86a, 86b, 87a, 87b within a housing is realized with the aid of a spring plate 81, as described below. Thus, a spring plate 81 is arranged between the contact head 70 and contact tappet 60 in such a way that, at its one end, it is supported against the contact tip 71 of contact head 70 directed toward the inside of the housing, and on the other end it is supported against contact surface 62 of contact tappet 60 directed inside the housing. A mechanical attachment of the spring plate 81 is realized by the fact that it is connected mechanically, rigidly and electrically conducting to the board 80 carrying the circuit.

Reference List

1*a* measuring unit
1*b* measuring unit
2 operating, measuring, display and printing module
3 sending element
4 receiving element
5 measuring channel connection
6 power supply connection
7 keyboard
8 display
9 printer
10 top side
11 bottom side
12 front side
13 back side
22 measuring module
23 measuring channel connection
24 measuring channel connection
25 measuring channel connection
26 measuring channel connection
27 rocker lever
31*a* groove
31*b* groove
31*c* groove
31*d* groove
32 measuring module
33 measuring channel connection
34 measuring channel connection
35 measuring channel connection
36 measuring channel connection
37 rocker lever
38*a* engagement element
38*b* engagement element
38*c* engagement element
38*d* engagement element
38*a*' engagement element
38*b*' engagement element
38*c*' engagement element
38*d*' engagement element
40 guide rails
40' guide rails
41*a* interval
41*b* interval
41*c* interval
42 radio module
43 sending element
44 receiving element
47 rocker lever
48*a* lever arm
48*b* lever arm
49*a* engagement element
49*b* engagement element
49*c* engagement element
49*d* engagement element
49*a*' engagement element
49*b*' engagement element
49*c*' engagement element
49*d*' engagement element
50 guide rails
50' guide rails
51*a* interval
51*b* interval
51*c* interval
52 rocker bearing
53 spring
54 latch
55 groove
60 contact tappet
61 contact tip
62 contact surface
63 sealing element
64 sealing lip
65 guide element
70 contact head
71 contact tip
72 contact surface
75 recess
76*a* bar
76*b* bar
80 board
81 spring plate
84*a* contact
84*b* contact
85*a* contact
85*b* contact
86*a* contact
86*b* contact
87*a* contact
87*b* contact
90 first contact surface
91 second contact surface
92 side surface
93 side surface
94 front surface
95 back surface
V shifting direction
$d_1$ distance
$d_2$ distance
M standardized measuring finger

What is claimed is:

1. A module for measuring purposes, comprising an electrical or electronic circuit having at least one power supply connection and at least one data line connection, wherein said module is adapted to be joined with at least one other module of the same type in the manner of a bus, and:

wherein said electronic circuit (80) is arranged in a housing having a first contact surface (90) and a second contact surface (91), wherein the first contact surface (90) can be connected with the second contact surface (91) of the other module (22, 32, 42), in a mechanically detachable manner;

wherein the at least one power supply connection always has a power supply contact (84*a*, 85*a*) in the first contact surface (90) and a corresponding power supply contact (84*b*, 85*b*) in the second contact surface (91) and the at least one data line connection always has a data line contact (86*a*, 87*a*) in the first contact surface (90) and a corresponding data line contact (86*b*, 87*b*) in the second contact surface (91);

wherein in the joined state the power supply contact (84*a*, 85*a*) in the first contact surface (90) is in electrical connection with the corresponding power supply contact (84*b*, 85*b*) in the second contact surface (91) of the other module (22, 32, 42) and the data line contact (86*a*, 87*a*) of the first contact surface (90) is in electrical connection with the corresponding data line contact (86*b*, 87*b*) in the second contact surface (91) of the other module (22, 32, 42); and wherein at least one contact (84*a*, 85*a*, 86*a*, 87*a*) of the first contact surface (90) is a contact head (70) with a contact surface (72), said contact head (70) located in a recess (75) of said first contact surface (90), and wherein the corresponding contact (84b', 85b', 86b', 87b') of the second contact surface (91) is a contact tappet (60) guided so that it can be moved essentially perpendicularly to contact surface (91) against the force of a spring (81).

2. The module according to claim 1, further comprising a bayonet-like connection for joining said module (22, 32, 42) with the other module (22, 32, 42).

3. The module according to claim 1, wherein the first and second contact surfaces (90, 91) are opposite housing surfaces lying essentially parallel to one another.

4. The module according to claim 1, wherein the first and second contact surfaces (90, 91) are the base and cover surfaces.

5. The module according to claim 1, wherein said housing has an essentially rectangular shape.

6. The module according to claim 1, wherein:
at least two essentially parallel guide rails (50, 50') are provided on the first contact surface (90), and, on the side of the rails away from contact surface (90), engagement elements (49a, 49b, 49c, 49d, 49a', 49b', 49c', 49d') are formed essentially parallel to the contact surface (90);
on the second contact surface (91), guide rails (40, 40') are provided that run essentially parallel to one another and correspond to the guide rails (50, 50') of the first contact surface (90), and, on their side away from the contact surface (91), engagement elements (38a, 38b, 38c, 38d, 38a', 38b', 38c',38d') are formed that run essentially parallel to contact surface (91) and correspond to the engagement elements (49a, 49b, 49c, 49d, 49a', 49b', 49c', 49d') of guide rails (50, 50') of the first contact surface (90), so that engagement elements (49a, 49b, 49c, 49d, 49a', 49b', 49c', 49d') are capable of overlapping engagement with the corresponding engagement elements (38a, 38b, 38c, 38d, 38a', 38b', 38c', 38d') of the other module (22, 32, 42), thus holding the modules (22, 32, 42) together.

7. The module according to claim 6, wherein:
the engagement elements (49a, 49b, 49c, 49d, 49a', 49b', 49c', 49d') and the corresponding engagement elements (38a, 38b, 38c, 38d, 38a', 38b', 38c',38d') are spaced in such a way that, for the purpose of joining the first contact surface (90) with the second contact surface (91) of the other module (22, 32, 42), the engagement elements (49a, 49b, 49c, 49d, 49a', 49b', 49c', 49d') are capable of engaging in the interval (41a, 41b, 41c, 41a', 41b', 41c') of the corresponding engagement elements (38a, 38b, 38c, 38d, 38a', 38b', 38c',38d') of the second contact surface (91) of the other module (22, 32, 42);
the corresponding engagement elements (38a, 38b, 38c, 38d, 38a', 38b', 38c',38d') of the second contact surface (91) of the other module are capable of engaging in the intervals (51a, 51b, 51c, 51a', 51b', 51c') of the engagement elements (49a, 49b, 49c, 49d, 49a', 49b', 49c', 49d'); and
the engagement elements (49a, 49b, 49c, 49d, 49a', 49b', 49c', 49d') are capable of being brought into an overlapping connection with the corresponding engagement elements (38a, 38b, 38c, 38d, 38a', 38b', 38c',38d') of the other module (22, 32, 42), by shifting the particular modules (22, 32, 42) against one another starting from an engaged position, thus holding the modules (22, 32, 42) together.

8. The module according to claim 1, wherein at least one rocker lever (27, 37, 47) is provided, which is tiltably supported on a rocker bearing (52) arranged on the side surface (92) of the housing, wherein one lever arm (48b) of the rocker lever (27, 37, 47) is supported against the force of a spring (53) on the side surface (92) and the other lever arm (48a) of the rocker lever (27, 37, 47) has a latch (54), which can be engaged into a groove (55) of the housing of the other module and can be locked with it.

9. The module according to claim 8, wherein the latch (54) engages in a groove (55), which is formed by the guide rails (40) and the engagement element (38b).

10. The module according to claim 1, further comprising a spring plate (81), which is supported on one end in a spring-like manner against a contact tip (71) of the contact head (70), is directed toward the inside of the housing, and is supported on the other end against the contact surface (62) of contact tappet (60), directed toward the inside of the housing, for producing electrical connection between the contact head (70) and the contact tappet (60) within the housing.

11. The module according to claim 10, wherein said circuit is arranged on a board (80) and said spring plate (81) is connected to the board (80) mechanically rigidly and in an electrically conducting manner.

12. The module according to claim 1, wherein the contact tappet (60) is adapted so that it can be shifted in a guide element (65) in which a sealing element (63) is inserted, which surrounds contact tappet (60) so that it can be shifted and which has a sealing lip inside (64) for sealing, surrounding the contact tappet (60) on its periphery.

13. The module according to claim 1, wherein the contact surface (72) of the contact head (70) is enclosed by two bars (76a, 76b) arranged essentially parallel to the guide rails (50, 50') and which protrude from the contact surface (72) of the contact head (70) in such a way that contacting it by a standardized measuring finger (M) is impossible.

14. The module according to claim 1, wherein the contact tip (61) of the contact tappet (60) protrudes from the base of a groove (31a, 31b, 31c, 31d) running essentially parallel to the guide rails (40, 40') formed in the contact surface (91) and wherein the width of the groove (31a, 31b, 31c, 31d) is selected so that contacting of the contact tip (61) of the contact tappet (60) by a standardized measuring finger (M) is impossible.

15. The module according to claim 1, wherein said circuit is capable of recording measured values (2, 22, 32).

16. The module according to claim 1, wherein said circuit is capable of providing said power supply.

17. The module according to claim 1, wherein said circuit is capable of providing a radio connection (42).

18. The module according to claim 1, wherein said circuit is capable of analog-digital conversion.

19. The module according to claim 1, wherein said circuit is capable of providing operating and display functions.

20. The module according to claim 1, wherein said circuit is capable of printing functions.

21. The module according to claim 1, wherein said circuit is capable of smoke analysis.

22. The module according to claim 1, wherein said data line connection is a CAN-Bus connection.

* * * * *